(12) United States Patent
Li

(10) Patent No.: US 11,385,485 B2
(45) Date of Patent: Jul. 12, 2022

(54) TEST WIRING STRUCTURE, TEST APPARATUS AND TEST SYSTEM

(71) Applicant: HKC CORPORATION LIMITED, Shenzhen (CN)

(72) Inventor: Zeyao Li, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 17/270,868

(22) PCT Filed: Dec. 18, 2018

(86) PCT No.: PCT/CN2018/121773
§ 371 (c)(1),
(2) Date: Feb. 24, 2021

(87) PCT Pub. No.: WO2020/098053
PCT Pub. Date: May 22, 2020

(65) Prior Publication Data
US 2021/0200001 A1 Jul. 1, 2021

(30) Foreign Application Priority Data

Nov. 12, 2018 (CN) .......................... 201821857989.8

(51) Int. Cl.
*G01R 27/00* (2006.01)
*G02F 1/13* (2006.01)
*G02F 1/1345* (2006.01)

(52) U.S. Cl.
CPC ............ *G02F 1/1309* (2013.01); *G01R 27/00* (2013.01); *G02F 1/13458* (2013.01)

(58) Field of Classification Search
CPC ..... G02F 1/1309; G02F 1/13458; G01R 27/00
See application file for complete search history.

(56) References Cited

U.S. PATENT DOCUMENTS

2005/0046439 A1    3/2005  Yu

FOREIGN PATENT DOCUMENTS

| CN | 101408582 A | 4/2009 |
| CN | 104035217 A | 9/2014 |
| CN | 104133333 A | 11/2014 |

(Continued)

OTHER PUBLICATIONS

Qinglin Yang, the International Searching Authority written comments, dated Aug. 2019, CN.

(Continued)

*Primary Examiner* — Donald L Raleigh

(57) ABSTRACT

Disclosed herein are a test wiring structure, a test apparatus and a test system. The test wiring structure includes sequentially cascaded signal wirings. Each signal wiring includes a first interface and a second interface respectively located at the two ends of the signal wiring, and a cascade interface disposed on the signal wiring. In the sequentially cascaded signal wirings, the first interface and the second interface of a previous-stage signal wiring are respectively connected to the cascade interfaces of corresponding signal wirings in next-stage signal wirings. Moreover, the cascade interface of a first-stage signal wiring is used to connect to a test pad, and the first interfaces and the second interfaces of last-stage signal wirings are respectively used to connect to corresponding display panels.

18 Claims, 2 Drawing Sheets

(56) References Cited

FOREIGN PATENT DOCUMENTS

| | | |
|---|---|---|
| CN | 104849880 A | 8/2015 |
| CN | 104880877 A | 9/2015 |
| CN | 105182213 A | 12/2015 |
| CN | 105609025 A | 5/2016 |
| CN | 106847181 A | 6/2017 |
| CN | 107015408 A | 8/2017 |
| WO | WO2005010600 A1 | 2/2005 |

OTHER PUBLICATIONS

Qinglin Yang, the International Searching Report, dated Aug. 2019, CN.

TEST WIRING STRUCTURE, TEST APPARATUS AND TEST SYSTEM

CROSS REFERENCE OF RELATED APPLICATIONS

The present application claims the priority to the Chinese Patent Application No. CN201821857989.8, filed with the National Intellectual Property Administration, PRC on Nov. 12, 2018 and entitled "TEST WIRING STRUCTURE, TEST APPARATUS AND TEST SYSTEM", which is incorporated herein by reference in its entirety.

TECHNICAL FIELD

The present application relates to the technical field of display, particularly to a test wiring structure, a test apparatus and a test system.

BACKGROUND

The statements herein merely provide background information related to the present application and do not necessarily constitute the conventional art. With the rapid development of liquid crystal display technology, people have increasingly higher requirements for the picture quality of a liquid crystal display panel. In order to ensure the display quality of the liquid crystal display panel, a Power Up Test is often required to be performed for the picture in the produced liquid crystal display panel, that is, a pressure head with a probe is pressed onto the liquid crystal display panel so that the probe is in contact with a signal input point of the liquid crystal display panel, and a corresponding test signal is input to light the liquid crystal display panel for testing, so as to determine whether the liquid crystal display panel displays normally.

In the traditional Power Up Test, a test pad needs to be pricked once for the test of each liquid crystal display panel, which takes much time. The test time is too long when testing a large number of liquid crystal display panels at the identical time. Therefore, the traditional Power Up Test method has low test efficiency.

SUMMARY

According to various embodiments of the present application, a test wiring structure, a test apparatus and a test system are provided.

A test wiring structure includes signal wirings that are sequentially cascaded, where each signal wiring includes a first interface, a second interface and a cascade interface, the first interface and the second interface being respectively located at the two ends of the signal wiring and the cascade interface being disposed on the signal wiring and positioned between the first interface and the second interface; in the sequentially cascaded signal wirings, the first interface and the second interface of a previous-stage signal wiring are respectively connected to the cascade interfaces of corresponding signal wirings in next-stage signal wirings; and the cascade interface of a first-stage signal wiring is used to connect to a test pad and the first interfaces and the second interfaces of last-stage signal wirings are respectively used to connect to corresponding display panels.

A test apparatus includes: test wirings including signal wirings that are sequentially cascaded, where each signal wiring includes a first interface, a second interface and a cascade interface, the first interface and the second interface being respectively located at the two ends of the signal wiring and the cascade interface being disposed on the signal wiring and positioned between the first interface and the second interface; in the sequentially cascaded signal wirings, the first interface and the second interface of a previous-stage signal wiring are respectively connected to the cascade interfaces of corresponding signal wirings in next-stage signal wirings; and the cascade interface of a first-stage signal wiring is used to connect to a test pad and the first interfaces and the second interfaces of last-stage signal wirings are respectively used to connect to corresponding display panels; probes disposed on the first interfaces and the second interfaces of the last-stage signal wirings, where the last-stage signal wirings are connected to the corresponding display panels through the probes; and the test pad disposed at the cascade interface of the first-stage signal wiring.

A test system includes display panels and a test apparatus including: test wirings including signal wirings that are sequentially cascaded, where each signal wiring includes a first interface, a second interface and a cascade interface, the first interface and the second interface being respectively located at the two ends of the signal wiring and the cascade interface being disposed on the signal wiring and positioned between the first interface and the second interface; in the sequentially cascaded signal wirings, the first interface and the second interface of a previous-stage signal wiring are respectively connected to the cascade interfaces of corresponding signal wiring in next-stage signal wirings; and the cascade interface of a first-stage signal wiring is used to connect to a test pad and the first interfaces and the second interfaces of last-stage signal wirings are respectively used to connect to corresponding display panels; probes disposed on the first interfaces and the second interfaces of the last-stage signal wirings, where the last-stage signal wirings are connected to the corresponding display panels through the probes; and the test pad disposed at the cascade interface of the first-stage signal wiring.

The details of one or more embodiments of the present application are set forth in the accompanying drawings and the description below. Other features, objects and advantages of the present application will be apparent from the specification, drawings and claims.

BRIEF DESCRIPTION OF DRAWINGS

In order to more clearly illustrate the technical solutions in the embodiments of the present application or in the conventional art, the drawings required in the description of the embodiments or the conventional art will be briefly described below. Obviously, the drawings in the following description are merely some embodiments of the present application, and those of ordinary skill in the art can obtain other drawings according, to the drawings without any inventive labor.

DETAILED DESCRIPTION OF EMBODIMENTS

Figure 1:
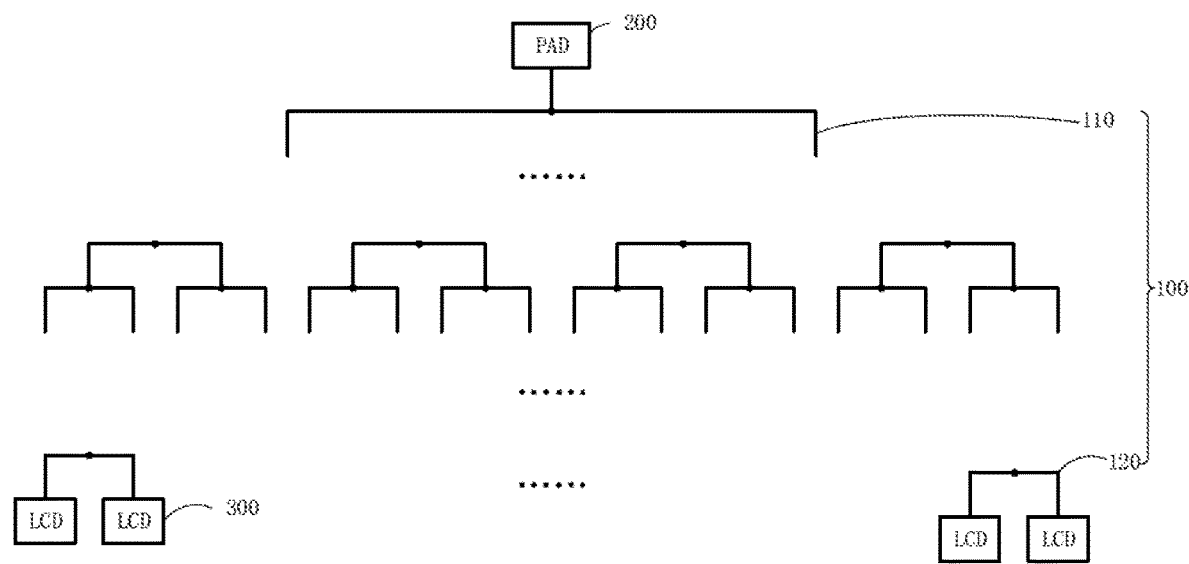
FIG. 1 is a schematic diagram of a test wiring structure according to an embodiment.

To facilitate understanding of the present application, the present application will now be described in more detail with reference to the related drawings. Optional embodiments of the present application are shown in the drawings. However, the present application may be embodied in many different forms and should not be construed as being limited to the embodiments described herein. Rather, these embodiments are provided to facilitate more thorough and complete understanding of the disclosure of the present application.

Referring to FIG. 1, a test wiring structure includes sequentially cascaded signal wirings 100. Each signal wiring 100 includes a first interface and a second interface respectively located at the two ends of the signal wiring 100 and a cascade interface disposed on the signal wiring 100. In the sequentially cascaded signal wirings 100, the first interface and the second interface of a previous-stage signal wiring are respectively connected to the cascade interfaces of corresponding signal wirings in next-stage signal wirings. Moreover, the cascade interface of a first-stage signal wiring 110 is used to connect to a test pad 200, and the first interfaces and the second interfaces of last-stage signal wirings 120 are respectively used to connect to corresponding display panels 300.

Figure 2:
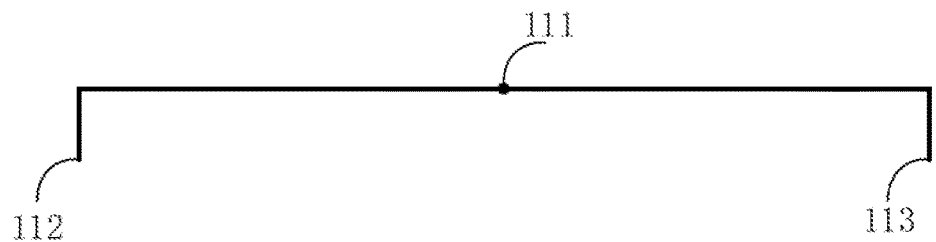
FIG. 2 is a schematic diagram of signal wiring interfaces according to an embodiment.

Specifically, a Power Up Test refers to a method of performing a lighting test of a display picture of a display panel after the display panel is produced and determining whether the display panel displays normally, and it has a good effect in terms of ensuring the display reliability of the display panel. In the Power Up Test of the display panels 300, a set of test pads 200 are often adopted to perform the lighting test of the display panels 300 one by one, and in the test process, the test pads 200 need to be pricked every time the display panels 300 are switched, so as to ensure that the test pads 200 can perform the lighting test of the corresponding display panels 300. This test method is only suitable for the Power Up Test of a small number of display panels 300. However, a relatively large number of display panels 300 are often cut and divided on a identical substrate for the Power Up Test, and if the test pad 200 is pricked every time the test is performed, a large amount of time will be consumed, resulting in low efficiency of the Power Up Test. Referring to FIG. 2, taking a first-stage signal wiring 110 connected to the test pad 200 as an example, the first-stage signal wiring 110 has a first interface 112 and a second interface 113 respectively located at the two ends of the signal wiring and a cascade interface 111 located on the signal wiring, and each signal wiring 100 has three interfaces identical to those of the first-stage signal wiring 110. In this solution, through the sequentially cascaded signal wires 100, in the sequentially cascaded signal wires 100, the first interface and the second interface of a previous-stage signal wire are respectively connected to the cascade interfaces of corresponding signal wires in next-stage signal wires, the cascade interface of the first-stage signal wire 110 is used to connect to the test pad 200, and the first interfaces and the second interfaces of last-stage signal wires 120 are respectively used to connect to the corresponding display panels 300. It can be understood that the signal wirings for connecting to the test pads 200 are used as the first-stage signal wirings 110, and the signal wirings for connecting to the display panels 300 are used as the last-stage signal wirings 120; the previous-stage signal wirings and the next-stage signal wirings are defined in a relative sense, and in two adjacent stages of signal wirings 100, one signal wiring 100 relatively close to the test pad 200 is used as the previous-stage signal wiring, and the signal wiring 100 relatively close to the display panel 300 (i.e., relatively far from the test pad 200) is used as the next-stage signal wiring.

It should be noted that the number of each stage of signal wirings 100 of the sequentially cascaded signal wirings 100 is sequentially increased from the first stage to the last stage, and the two interfaces of a previous-stage signal wiring are respectively connected to the cascade interfaces of two different signal wirings in next-stage signal wirings. Therefore, it can be understood as that the number of the first-stage signal wirings 110 is 1 (i.e., $2^0$), the number of the corresponding signal wirings 100 of the following stages is sequentially 2 (i.e., $2^1$), 4 (i.e., $2^2$), 8 (i.e., $2^3$) ..., and the number of the corresponding signal wirings of the $n^{th}$ stage the last-stage signal wirings 120) is $2^{n-1}$ and the first interfaces and the second interfaces of the signal wirings of the $n^{th}$ stage are correspondingly connected to $2^n$ display panels 300. In summary, by adopting the design method of the signal wirings 100 described above, the Power Up Test of $2^n$ display panels 300 through a set of test pads 200 can be realized by designing the n-stage sequentially cascaded signal wirings 100, and in the test process, the test pads 200 only need to be pricked once, thereby greatly shortening the time of Power Up Test of a large number of display panels 300 and effectively improving the efficiency of the Power Up Test.

Figure 3:
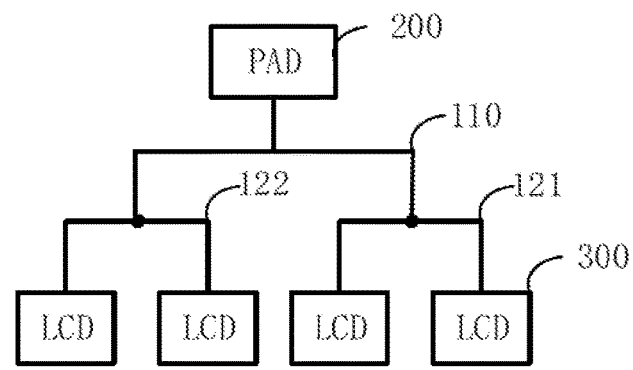
FIG. 3 is a schematic diagram of a test wiring structure according to another embodiment.

In one or more embodiments, referring to FIG. 3, the signal wirings 100 have two stages, where the last-stage signal wirings include a first final-stage signal wiring 121 and a second final-stage signal wiring 122; the first interface of the first final-stage signal wiring 121, the second interface of the first final-stage signal wiring 121, the first interface of the second final-stage signal wiring 122 and the second interface of the second final-stage signal wiring 122 are respectively used to connect to corresponding display panels 300; and the first interface of the first-stage signal wiring 110 is connected to the cascade interface of the first final-stage signal wiring 121, and the second interface of the first-stage signal wiring 110 is connected to the cascade interface of the second final-stage signal wiring 122.

Specifically, taking two-stage signal wirings 100 as an example, the corresponding first-stage signal wiring 110 serves as a previous-stage signal wiring of the last-stage signal wiring, and the last-stage signal wiring serves as a next-stage signal wiring of the first-stage signal wiring 110. Therefore, the cascade interface of the first-stage signal wiring 110 is used to connect to the test pad 200, the first interface of the first-stage signal wiring 110 is connected to the cascade interface of the first final-stage signal wiring 121 in the last-stage signal wirings, the second interface of the first-stage signal wiring 110 is connected to the cascade interface of the second final-stage signal wiring 122 in the last-stage signal wirings, and the first interface and the second interface of the first final-stage signal wiring 121 and the first interface and the second interface of the second final-stage signal wiring 122 are respectively connected to different display panels 300. Through the layout of the two-stage signal wirings 100, the Power Up Test of four display panels 300 can be realized by adopting a set of test pads 200, and thus the advantage of high operational convenience is provided. It can be understood that in other embodiments, the signal wirings 100 may have other stages, and accordingly the Power Up Test of a plurality of display panels 300 is realized by adopting a set of test pads 200, so as to improve the efficiency of the Power Up Test.

It should be noted that in one or more embodiments, the cascade interfaces are all located at a half-resistance position of the signal wirings 100. Specifically, when performing the Power Up Test, in order to ensure the accuracy of the test results, the cascade interfaces are disposed at the half-resistance position of the signal wirings 100, that is, one signal wiring 100 can be divided into two signal wirings 100 with equal resistance through the point, so that the resistance of the signal wirings 100 from each display panel 300 to the test pad 200 are the identical, so as to ensure that the corresponding test signals sent by each display panels 300 are consistent when received by the test pad 200. It can be understood that in one or more embodiments, the signal wirings 100 are identical in material, length and cross-sectional area, and in order to ensure that the resistances of the signal wirings 100 from the display panels 300 to the test pad 200 are the identical, the only thing to do is to dispose the cascade interfaces at the midpoint of each signal wiring 100, which has the advantage of simple operation. In other embodiments, the half-resistance position of each signal wiring 100 may also be determined by other means, for example, by software simulation, and the obtained half-resistance position has the advantage of high accuracy.

In one or more embodiments, the signal wirings 100 each include three signal lines. Specifically, each signal wiring 100 includes three different signal lines, which respectively provide different test signals to the test pad 200. In one or more embodiments, the three signal lines are a red signal line, a green signal line and a blue signal line, which provide gray-scale voltages, data signals, etc. to red pixel units, green pixel units and blue pixel units of the display panel 300 respectively through the test pad 200. At this time, in all the signal wirings 100, the red signal line is connected correspondingly to the red signal line, the green signal line is connected correspondingly to the green signal line, and the blue signal line is connected correspondingly to the blue signal line, that is, the first interface and the second interface of the red signal line in the previous-stage signal wiring are respectively connected to the cascade interfaces of corresponding red signal lines in the next-stage signal wiring, the first interface and the second interface of the green signal line in the previous-stage signal wiring, are respectively connected to the cascade interfaces of corresponding green signal lines in the next-stage signal wiring, and the first interface and the second interface of the blue signal line in the previous-stage signal wiring are respectively connected to the cascade interfaces of corresponding blue signal lines in the next-stage signal wiring.

It can be understood that in other embodiments, the number of the signal lines in the signal wiring 100 may be different from three. For example, in one embodiment, each signal line includes four signal lines, namely a red signal line, a green signal line, a blue signal line and a white signal line, which provide gray-scale voltages, data signals, etc. to red pixel units, green pixel units, blue pixel units and white pixel units of the display panel 300 respectively through the test pad 200, so as to realize the Power Up Test of a plurality of display panels 300 through the identical test pad 200.

The test wiring structure described above includes sequentially cascaded signal wirings, where in the sequentially cascaded signal wirings, the first interface and the second interface of a previous-stage signal wiring are respectively connected to cascade interfaces of corresponding signal wirings in next-stage signal wirings, and the first interfaces of last-stage signal wirings and the second interfaces of last-stage signal wirings are respectively connected to different display panels, and the cascade interface of the first-stage signal wiring is connected to a test pad, and thus corresponding data of the display panels can be collected through the last-stage signal wirings and sent to the test pad via the cascade interface of the first-stage signal wiring of the cascaded test wirings, and then the corresponding Power Up Test operation is completed through the test pad. Through the test wiring structure described above, the Power Up Test of a plurality of display panels can be completed only by adopting one test pad, and the pricking of the test pad is not required to be repeated in the test process. When performing Power Up Test of a plurality of display panels, compared with the traditional Power Up Test method, the pricking time can be effectively shortened, thus effectively improving the efficiency of the Power Up Test.

Figure 4:
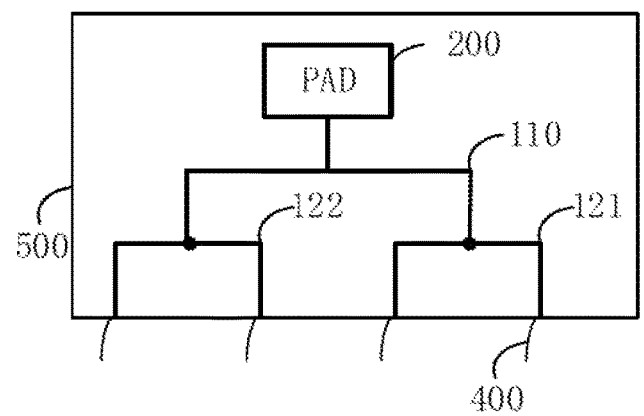
FIG. 4 is a structural schematic diagram of a test apparatus according to an embodiment.

Referring to FIG. 4, a test apparatus includes probes 400, a test pad 200 and test wirings having the structure as described above, where the cascade interface of a first-stage signal wiring 110 is connected to the test pad 200, first interfaces and second interfaces of last-stage signal wirings (including a first final-stage signal wiring 121 and a second final-stage signal wiring 122, the first interfaces being the first interface of the first final-stage signal wiring 121 and the first interface of the second final-stage signal wiring 122, and the second interfaces being the second interface of the first final-stage signal wiring 121 and the second interface of the second final-stage signal wiring 122) are all arranged with the probe 400, and the last-stage signal wirings are connected to corresponding display panels through the probes 400. The specific structure of the test wirings is explained in detail above and will not be described here again, and it can be understood that the test wirings in the test apparatus may be the test wirings in any of the above embodiments, as long as the test of the display panels can be achieved.

Specifically, through the sequentially cascaded signal wirings 100, in the sequentially cascaded signal wirings 100, the first interface and the second interface of a previous-stage signal wiring are respectively connected to cascade interfaces of corresponding signal wirings in next-stage signal wirings, the cascade interface of the first-stage signal wiring 110 is connected to the test pad 200, first interfaces and second interfaces of last-stage signal wirings are respectively connected with the probes 400, and the first interfaces and the second interfaces of the last-stage signal wirings are respectively connected to corresponding display panels through the probes 400; when there's a need to perform Power Up Test of the display panels, the only thing to do is to press the probes 400 onto corresponding display panels, so that the probes 400 are in contact with corresponding signal contact points in the display panels, and then the Power Up Test of the display panels is completed through the Power Up Test apparatus. It can be understood that the signal wirings for connecting to the test pads 200 are used as the first-stage signal wirings 110, and the signal wirings for connecting to the display panels are used as the last-stage signal wirings; the previous-stage signal wirings and the next-stage signal wirings are defined in a relative sense, and in two adjacent stages of signal wirings 100, one signal wiring 100 relatively close to the test pad 200 is used as the previous-stage signal wiring, and the signal wiring 100 relatively close to the display panel (i.e., relatively far from the test pad 200) is used as the next-stage signal wiring.

It should be noted that the number of each stage of signal wirings 100 of the sequentially cascaded signal wirings 100 is sequentially increased from the first stage to the last stage, and the two interfaces of a previous-stage signal wiring are respectively connected to the cascade interfaces of two different signal wirings in next-stage signal wirings. Therefore, it can be understood as that the number of the first-stage signal wirings 110 is 1 (i.e., $2^0$), the number of the corresponding signal wirings 100 of the following stages is sequentially 2 (i.e., $2^1$), 4 (i.e., $2^2$), 8 (i.e., $2^3$) . . . , and the number of the corresponding signal wirings of the $n^{th}$ stage (i.e., the last-stage signal wirings) is $2^{n-1}$, and the first interfaces and the second interfaces of the signal wirings of the $n^{th}$ stage are correspondingly connected to $2^n$ display panels. In summary, by adopting the design method of the signal wirings 100 described above, the Power Up Test of $2^n$ display panels through a set of test pads 200 can be realized by designing the n-stage sequentially cascaded signal wirings 100, and in the test process, the test pads 200 only need to be pricked once, thereby greatly shortening the time of Power Up. Test of a large number of display panels and effectively improving the efficiency of the Power Up Test.

Further, in one or more embodiments, taking two-stage signal wirings as an example, the cascade interface of the first-stage signal wiring 110 is used to connect to the test pad 200, the first interface of the first-stage signal wiring 110 is connected to the cascade interface of the first final-stage signal wiring 121 in the last-stage signal wirings, the second interface of the first-stage signal wiring 110 is connected to the cascade interface of the second final-stage signal wiring 122 in the last-stage signal wirings, and the first interface and the second interface of the first final-stage signal wiring 121 and the first interface and the second interface of the second final-stage signal wiring 122 are respectively connected with probes 400. When performing a Power Up Test, the only thing to do is to press the probes 400 onto corresponding contact points on the display panels and then input test signals to complete corresponding Power Up Test.

In one or more embodiments, the test pad 200 includes a micro control unit, a processing unit and a signal conversion chip, where the micro-control unit is connected to the processing unit, the processing unit is connected to the signal conversion chip, and the signal conversion chip is connected to the cascade interface of the first-stage signal wiring 110.

Specifically, the micro control unit receives timing information for lighting the display panels and sends the timing information to the processing unit, the processing unit converts the processed timing information and gray-scale voltages and data signals of red, green and blue pixels generated inside into Transistor-Transistor Logic (TTL) digital signals and sends the timing information and the gray-scale voltages and the data signals of the red, green and blue pixels converted into the TTL digital signals to the signal conversion chip, and the signal conversion chip further converts the received signals into Mobile Industry Processor Interface (MIPI) signals or Embedded Display Port (EDP) signals required by interfaces of display panels and then sends them to the display panels to complete the Power Up Test of the display panels.

Further, in one or more embodiments, the processing unit is a Field-Programmable Gate Array (FPGA). Specifically, the FPGA enables users to combine freely so as to realize different circuit functions, and it has the advantages of higher efficiency and speed compared with the traditional processors such as a CPU, a GPU, etc. The FPGA is adopted to process timing information, convert the processed timing information and gray-scale voltages and data signals of red, green and blue pixels generated by display panels into digital signals, and send the digital signals to the signal conversion chip for processing, thereby completing the Power Up Test operation of the display panels. It can be understood that in other embodiments, the processing unit may also be other types of programmable devices, such as Programmable Array Logic (PAL), Complex Programmable Logic Device (CPLD), etc., as long as they can realize functions similar to those of the FPGA described above.

Continue to refer to FIG. 4, in one or more embodiments, the test apparatus further includes a substrate 500, and the test pad 200, the probes 400 and the test wirings are fixedly disposed on the substrate 500. Specifically, taking two-stage signal wirings 100 as an example, the test pad 200, the probes 400 and the signal wirings 100 are all fixedly disposed on the substrate 500, and the only thing to do is to press the probes 400 fixed on the substrate 500 onto the display panels when performing the Power Up Test. Fixedly disposing the test pad 200, the probes 400 and the signal wirings 100 on the substrate 500 helps to protect the signal wirings 100 and has the advantage of high operational convenience in the Power Up Test. Further, in one or more embodiments, the substrate 500 is a glass substrate. The glass substrate is used as the substrate 500, and the test pad 200, the probes 400 and the signal wirings 100 are all disposed on the glass substrate to realize the Power Up Test of the display panels, thus providing the advantages of easy realization and low cost.

In the test apparatus described above, the test wirings include sequentially cascaded signal wirings, where in the sequentially cascaded signal wirings, the first interface and the second interface of a previous-stage signal wiring are respectively connected to cascade interfaces of corresponding signal wirings in next-stage signal wirings, and the first interfaces of last-stage signal wirings and the second interfaces of last-stage signal wirings are respectively connected to different display panels and the cascade interface of the first-stage signal wiring is connected to a test pad, and thus corresponding data of the display panels can be collected through the last-stage signal wirings and sent to the test pad via the cascade interface of the first-stage signal wiring of the cascaded test wirings, and then the corresponding Power Up Test operation is completed through the test pad. Through the test apparatus described above, the Power Up Test of a plurality of display panels can be completed only by adopting one test pad, and the pricking of the test pad is not required to be repeated in the test process. When performing Power Up Test of a plurality of display panels, compared with the traditional Power Up Test method, the pricking time can be effectively shortened, thus effectively improving the efficiency of the Power Up Test.

Figure 5:
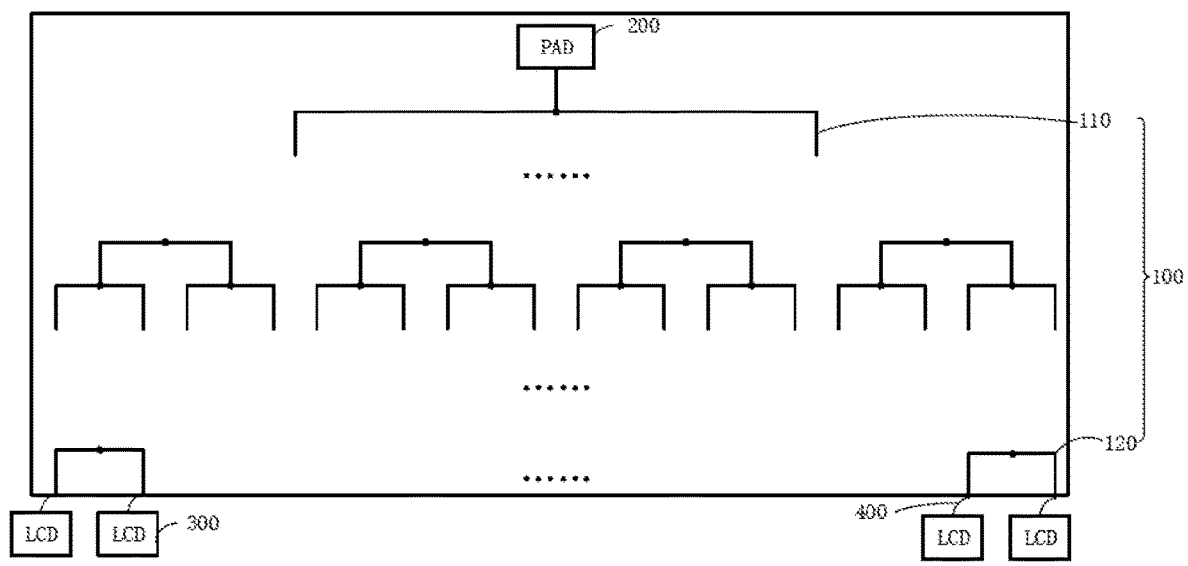
FIG. 5 is a structural schematic diagram of a test system according to an embodiment.

Referring to FIG. 5, a test system includes display panels 300 and a test apparatus, where the test apparatus is connected to corresponding display panels 300 through probes 400, respectively. It can be understood that the test apparatus may be specifically the test apparatus described in any of the above embodiments, and the specific structure has been explained in detail in the above embodiments and will not be described here again.

Specifically, in the test system, through the sequentially cascaded signal wirings 100, in the sequentially cascaded signal wirings 100, the first interface and the second interface of a previous-stage signal wiring, are respectively connected to cascade interfaces of corresponding signal wirings in next-stage signal wirings, the cascade interface of the first-stage signal wiring 110 is connected to the test pad 200, first interfaces and second interfaces of last-stage signal wirings 120 are respectively connected with the probes 400, and the first interfaces and the second interfaces of the last-stage signal wirings 120 are respectively connected to corresponding display panels 300 through the probes 400; when there's a need to perform Power Up Test of the display panels 300, the only thing to do is to press the probes 400 onto corresponding display panels 300, so that the probes 400 are in contact with corresponding signal contact points in the display panels 300, and then the Power Up Test of the display panels 300 is completed through the Power Up Test apparatus. It can be understood that the signal wirings for connecting to the test pads 200 are used as the first-stage signal wirings 110, and the signal wirings for connecting to the display panels 300 are used as the last-stage signal wirings 120; the previous-stage signal wirings and the next-stage signal wirings are defined in a relative sense, and in two adjacent stages of signal wirings 100, one signal wiring 100 relatively close to the test pad 200 is used as the previous-stage signal wiring, and the signal wiring 100 relatively close to the display panel 300 (i.e., relatively far from the test pad 200) is used as the next-stage signal wiring.

It should be noted that the number of each stage of signal wirings 100 of the sequentially cascaded signal wirings 100 is sequentially increased from the first stage to the last stage, and the two interfaces of a previous-stage signal wiring are respectively connected to the cascade interfaces of two different signal wirings in next-stage signal wirings. Therefore, it can be understood as that the number of the first-stage signal wirings 110 is 1 (i.e., $2^0$), the number of the corresponding signal wirings 100 of the following stages is sequentially 2 (i.e., $2^1$), 4 (i.e., $2^2$), 8 (i.e., $2^3$) . . . , and the number of the corresponding signal wirings of the $n^{th}$ stage the last-stage signal wirings 120) is $2^{n-1}$, and the first interfaces and the second interfaces of the signal wirings of the $n^{th}$ stage are correspondingly connected to $2^n$ display panels 300. In summary, by adopting the design method of the signal wirings 100 described above, the Power Up Test of $2^n$ display panels 300 through a set of test pads 200 can be realized by designing the n-stage sequentially cascaded signal wirings 100, and in the test process, the test pads 200 only need to be pricked once, thereby greatly shortening the time of Power Up Test of a large number of display panels 300 and effectively improving the efficiency of the Power Up Test. It should be noted that, in one or more embodiments, the display panels 300 are identical in model, that is, the test of a large number of display panels 300 of the identical model can be completed by one test apparatus, which has the advantage of high testing efficiency.

In one or more embodiments, the display panel 300 is a Liquid Crystal Display (LCD) panel. The LCD panel is a display panel with an ultra-thin plane, and it is composed of a certain number of color pixels or black and white pixels and is placed in front of a light source or a reflecting surface. The LCD panel has the advantages of low power consumption, power saving, low radiation and soft picture, and it is widely used in daily life. The LCD panel is also required to be subjected to Power Up Test when the production is finished so as to ensure that the display picture of the LCD panel is normal.

In one or more embodiments, the display panel includes an array substrate disposed with pixel units arranged in an array. Specifically, the array substrate has a plurality of data lines arranged along a first direction and a plurality of scanning lines arranged along a second direction, and the plurality of data lines arranged along the first direction and the plurality of scanning lines arranged along the second direction are in insulated intersection. Pixel units arranged in an array are defined at the insulated intersection position of each data line and each scanning line, and after driving signals are provided to the pixel units through the data lines and the scanning lines, the pixel units emit light to complete image display.

In one or more embodiments, the pixel units include Red (R) pixel units, Green (G) pixel units and Blue (B) pixel units. In this embodiment, the signal wiring in the corresponding test wiring structure includes three signal lines, which provide gray-scale voltages, data signals, etc. to the Red pixel units, the Green pixel units and the Blue pixel units of the display panel 300 respectively through the test pad 200.

In one or more embodiments, the pixel units include Red pixel units, Green pixel units, Blue pixel units and White (W) pixel units, and the corresponding signal wirings in the test wiring structure include three signal lines, which provide gray-scale voltages, data signals, etc. to the Red pixel units, the Green pixel units and the Blue pixel units of the display panel 300 respectively through the test pad 200.

In one or more embodiments, the LCD panel is a Twisted Nematic (TN) panel. It can be understood that, in other embodiments, other types of display panels are also possible, for example, In-Plane Switching (IPS) panels, Multi-domain Vertical Alignment (MVA) panels, etc., as long as they are applicable.

In the test system described above, the test wirings include sequentially cascaded signal wirings, where in the sequentially cascaded signal wirings, the first interface and the second interface of a previous-stage signal wiring are respectively connected to cascade interfaces of corresponding signal wirings in next-stage signal wirings, and the first interfaces of last-stage signal wirings and the second interfaces of last-stage signal wirings are respectively connected to different LCD panels and the cascade interface of the first-stage signal wiring is connected to a test pad, and thus corresponding data of the LCD panels can be collected through the last-stage signal wirings and sent to the test pad via the cascade interface of the first-stage signal wiring of the cascaded test wirings, and then the corresponding Power Up Test operation is completed through the test pad. Through the test system described above, the Power Up Test of a plurality of LCD panels can be completed only by adopting one test pad, and the pricking of the test pad is not required to be repeated in the test process. When performing Power Up Test of a plurality of LCD panels, compared with the traditional Power Up Test method, the pricking time can be effectively shortened, thus effectively improving the efficiency of the Power Up Test.

The technical features of the above embodiments can be combined arbitrarily. For the sake of brevity, all possible combinations of the technical features of the above embodiments are not described, and such combinations of the technical features shall be deemed to fall within the scope of the present disclosure as long as there is no contradiction.

The embodiments above only describe several implementations of the present application, and the description thereof is specific and detailed. However, those cannot be therefore construed as limiting the scope of the present application. It should be noted that, for those of ordinary skill in the art, several variations and modifications can be made without departing from the concept of the present disclosure, which also fall within the scope of the present disclosure. Therefore, the protection scope of the present application shall be defined by the appended claims.

What is claimed is:
1. A test wiring structure, comprising:
   signal wirings, wherein the signal wirings are sequentially cascaded;
   each signal wiring comprises a first interface, a second interface and a cascade interface, the first interface and the second interface being respectively located at the two ends of the signal wiring, and the cascade interface being disposed on the signal wiring and positioned between the first interface and the second interface; and in the sequentially cascaded signal wirings, the first interface and the second interface of a previous-stage signal wiring are respectively connected to the cascade interfaces of corresponding signal wirings in next-stage signal wirings, and the cascade interface of a first-stage signal wiring is configured to connect to a test pad, and the first interfaces and the second interfaces of last-stage signal wirings are respectively configured to connect to corresponding display panels.

2. The test wiring structure according to claim 1, wherein the signal wirings have two stages; the last-stage signal wirings comprise a first final-stage signal wiring and a second final-stage signal wiring; the first interface of the first final-stage signal wiring, the second interface of the first final-stage signal wiring, the first interface of the second final-stage signal wiring and the second interface of the second final-stage signal wiring are respectively configured to connect to corresponding display panels; and the first interface of the first-stage signal wiring is connected to the cascade interface of the first final-stage signal wiring, and the second interface of the first-stage signal wiring is connected to the cascade interface of the second final-stage signal wiring.

3. The test wiring structure according to claim 1, wherein the cascade interfaces are each located at a half-resistance position of the signal wirings.

4. The test wiring structure according to claim 3, wherein each signal wiring is identical in material, length and cross-sectional area, and the cascade interfaces are disposed at a midpoint of each signal wiring.

5. The test wiring structure according to claim 1, wherein the signal wirings each comprise three signal lines.

6. The test wiring structure according to claim 1, wherein the signal wirings each comprise four signal lines.

7. A test apparatus, comprising:
test wirings, comprising signal wirings that are sequentially cascaded, wherein each signal wiring comprises a first interface, a second interface and a cascade interface, the first interface and the second interface being respectively located at the two ends of the signal wiring, and the cascade interface being disposed on the signal wiring and positioned between the first interface and the second interface, and in the sequentially cascaded signal wirings, the first interface and the second interface of a previous-stage signal wiring are respectively connected to the cascade interfaces of corresponding signal wirings in next-stage signal wirings, and the cascade interface of a first-stage signal wiring is connected to a test pad and the first interfaces and the second interfaces of last-stage signal wirings are respectively configured to connect to corresponding display panels;
probes, disposed on the first interfaces and the second interfaces of the last-stage signal wirings, wherein the last-stage signal wirings are connected to the corresponding display panels through the probes; and
the test pad, disposed at the cascade interface of the first-stage signal wiring.

8. The test apparatus according to claim 7, wherein the test pad comprises a micro control unit, a processing unit and a signal conversion chip, the micro-control unit being connected to the processing unit, the processing unit being connected to the signal conversion chip, and the signal conversion chip being connected to the cascade interface of the first-stage signal wiring.

9. The test apparatus according to claim 8, wherein the processing unit is a Field-Programmable Gate Array.

10. The test apparatus according to claim 7, wherein the apparatus further comprises a substrate, and the test pad, the probes and the test wirings are fixedly disposed on the substrate.

11. The test apparatus according to claim 10, wherein the substrate is a glass substrate.

12. A test system, comprising display panels and a test apparatus, wherein the test apparatus is connected to corresponding display panels through probes, respectively, and the test apparatus comprises:
test wirings, comprising signal wirings that are sequentially cascaded, wherein each signal wiring comprises a first interface, a second interface and a cascade interface, the first interface and the second interface being respectively located at the two ends of the signal wiring, and the cascade interface being disposed on the signal wiring and positioned between the first interface and the second interface, and in the sequentially cascaded signal wirings, the first interface and the second interface of a previous-stage signal wiring are respectively connected to the cascade interfaces of corresponding signal wirings in next-stage signal wirings, and the cascade interface of a first-stage signal wiring is connected to a test pad and the first interfaces and the second interfaces of last-stage signal wirings are respectively configured to connect to corresponding display panels;
probes, disposed on the first interfaces and the second interfaces of the last-stage signal wirings, wherein the last-stage signal wirings are connected to the corresponding display panels through the probes; and
the test pad, disposed at the cascade interface of the first-stage signal wiring.

13. The test system according to claim 12, wherein the displays panel comprises an array substrate disposed with pixel units arranged in an array.

14. The test system according to claim 13, wherein the pixel units comprise red pixel units, green pixel units and blue pixel units.

15. The test system according to claim 13, wherein the pixel units comprise red pixel units, green pixel units, blue pixel units and white pixel units.

16. The test system according to claim 12, wherein the display panels are identical in model.

17. The test system according to claim 12, wherein the display panels are Liquid Crystal Display panels.

18. The test system according to claim 17, wherein the Liquid Crystal Display panels are Twisted Nematic panels.

* * * * *